(12) United States Patent
Kuroki et al.

(10) Patent No.: US 7,201,176 B2
(45) Date of Patent: Apr. 10, 2007

(54) WAFER CHUCKING APPARATUS FOR SPIN PROCESSOR

(75) Inventors: Kyoko Kuroki, Matsudo (JP); Hideaki Seto, Kuzatsu (JP)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 11/403,137

(22) Filed: Apr. 11, 2006

(65) Prior Publication Data

US 2006/0180176 A1   Aug. 17, 2006

Related U.S. Application Data

(62) Division of application No. 10/417,708, filed on Apr. 16, 2003, now Pat. No. 7,056,392.

(51) Int. Cl.
 *B08B 3/00* (2006.01)

(52) U.S. Cl. .................. 134/142; 134/92; 134/137; 134/157; 134/140; 134/164; 156/345.51; 156/345.54; 156/345.55

(58) Field of Classification Search ............... 134/92, 134/137, 140, 142, 157, 164; 156/345.51, 156/345.54, 345.55
See application file for complete search history.

(56) References Cited

U.S. PATENT DOCUMENTS 5,820,685 A * 10/1998 Kurihara et al. ............ 118/729
7,056,392 B1 * 6/2006 Kuroki et al. ................ 134/33

FOREIGN PATENT DOCUMENTS

EP    2 242 065    * 10/1987
JP      9107023   *  4/1997

* cited by examiner

*Primary Examiner*—M. Kornakov
(74) *Attorney, Agent, or Firm*—Beyer Weaver LLP

(57) ABSTRACT

A wafer chuck is configured to hold a wafer efficiently for spin process cleaning of wafer edges and back sides. A first group of retractable tips extend to hold the wafer during a first portion of the cleaning period. A second group of retractable tips extend to hold the wafer during a second portion of the cleaning period. Residues left between the tips and the wafer edge areas during the first portion of the cleaning period are removed during the second portion. The change from the first group of tips to the second group of tips occurs while the wafer is rotating.

11 Claims, 2 Drawing Sheets

WAFER CHUCKING APPARATUS FOR SPIN PROCESSOR

RELATED APPLICATION (PRIORITY CLAIM)

This patent application is a divisional of U.S. patent application Ser. No. 10/417,708, filed on Apr. 16, 2003 now U.S. Pat. No. 7,056,392.

BACKGROUND OF THE INVENTION

1. Field of the Invention

The present invention relates to methods and apparatus for cleaning deposits from a semiconductor wafer. More particularly, the present invention relates to methods and apparatus for chucking a wafer for cleaning deposited films and flakes from the edge and bevel portions of a semiconductor wafer.

2. Description of the Related Art

Semiconductor wafer fabrication involves a series of processes used to create semiconductor devices and integrated circuits (ICs) in and on a semiconductor wafer surface. Fabrication typically involves the basic operations of layering and patterning, together with others such as doping, and heat treatments. Layering is an operation used to add thin layers of material (typically insulator, semiconductor or conductor) to the surface of the semiconductor wafer. Patterning is an operation that is used to remove specific portions of the top layer or layers on the wafer surface.

Once the integrated circuits on the wafer are completed, i.e., layering and patterning are implemented, the wafer is conventionally sliced into sections known as die. A large number of wafers are diced from a wafer, typically 100 to 1000. A wafer may comprise as many as 10 or more layers, each layer formed in a separate step. During processing of semiconductor wafers, films (i.e., layers) are deposited not only on the selected areas of the wafer surface designated for the die, but also on the margin of the wafer, i.e., the wafer edge and the bevel. The films may also be deposited on the backside of the wafer near the edge. These films located at or near the edge may become problematic during subsequent processing, such as occurring when the edge deposits begin to flake or peel off. This may result in contamination during subsequent process steps. For example, such flakes may cause a bridge between two conductors or prevent the formation of a pattern. The flaking may therefore cause processing defects which may result in die failure at test.

As integrated circuit devices grow smaller, higher conductance and lower capacitance is required of the interconnects. In order to accommodate these objectives, the trend has been towards the use of copper for interconnects and damascene methods for forming the interconnects in low-k dielectric materials. But fabrication processes that use copper interconnects require higher levels of cleanliness for the edge, beveled regions and back side of the wafer to prevent contamination of subsequent process steps.

One method for cleaning these deposits involves a spin processor, i.e., placing the wafer on a chuck and spinning the wafer at high speeds while selectively dispersing one or more chemicals over the wafer surface. But typically spin processors hold wafers at the wafer edge with tips that are nail like. With this method, any copper contamination located between the tips of the chuck and the wafer bevel or edge cannot be completely cleaned. Moreover, the tips of the chuck adversely influence the cleaning efforts directed to the backside off the wafer by disturbing the chemical flow.

Accordingly, it is desirable to provide a more effective method and apparatus for removing films from the bevel and edge of a wafer. Thus, what is needed is an improved wafer holder and method for holding a wafer during spin process cleaning.

SUMMARY OF THE INVENTION

To achieve the foregoing, the present invention provides methods and apparatus for holding a wafer during the cleaning of the edge and back sides of a wafer during the manufacture of semiconductor integrated circuits. A wafer chuck rotates the wafer at high speeds during single wafer spin process cleaning steps directed to the edge, bevel, and backside of the wafer. In order to rotate the wafer while minimizing the influence of the chuck on chemicals directed to the wafer, retractable tips extend to the wafer edge. The tips are divided into groups so that during one part of the spin process cleaning, a first group of tips engage the edge of the wafer. During a second part of the cleaning step, a second group of tips are extended to the wafer edge to hold the wafer. Shortly thereafter, the first tips are retracted to permit cleaning of deposits or flakes located at the points of contact between the first group of tips and the wafer edge. With this arrangement, complete cleaning of the entire wafer edge, bevel, and backside areas may be performed without flakes or other deposit remnants contaminating future process steps.

According to one embodiment of the present invention, a wafer chuck for supporting a wafer during spin process cleaning of a wafer includes a first plurality of retractable tips for engaging the edge of the wafer. The wafer chuck also includes a second plurality of retractable tips, also for engaging the edge of the wafer. Each of the pluralities are configured so that in a first state the first plurality of tips is engaged with the edge of the wafer and the second plurality is retracted from the edge of the wafer. The tips are further configured so that in a second state, the first plurality of tips are not engaged with the edge of the wafer while each the second plurality of tips is engaged.

According to another embodiment of the present invention, the wafer chuck includes further a third plurality of retractable tips. In this embodiment, the first, second, and third pluralities of retractable tips are further configured so that in a in a third state the first and second pluralities of retractable tips are retracted from the edge of the wafer while the third plurality of retractable tips is engaged with the edge of the wafer.

These and other features and advantages of the present invention are described below with reference to the drawings.

DETAILED DESCRIPTION OF PREFERRED EMBODIMENTS

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides improved methods and apparatus for using a wafer chuck to hold a wafer during spin processing. These embodiments may be used during the cleaning and etching of the edge and back side of a wafer during the manufacture of semiconductor integrated circuits. A typical objective is to clear a 2 mm portion from the edge of the wafer inward. A spin processing apparatus in accordance with one embodiment of the present invention is constructed with retractable tips engaging the edge of the wafer and extending from the wafer chuck. In order to rotate the wafer while minimizing the influence of the chuck on chemicals directed to the wafer, retractable tips extend to the wafer edge. The tips are divided into groups so that during one part of the spin process cleaning, a first group of tips engages the edge of the wafer. During a second part of the cleaning step, a second group of tips is extended to the wafer edge to hold the wafer. Shortly thereafter, i.e., shortly after the second group is extended, the first tips are retracted to permit cleaning of deposits or flakes located at the points of contact between the first group of tips and the wafer edge. With this arrangement, complete cleaning of the entire wafer edge, bevel, and backside areas may be performed without flakes or other deposit remnants contaminating future process steps.

Figure 1:
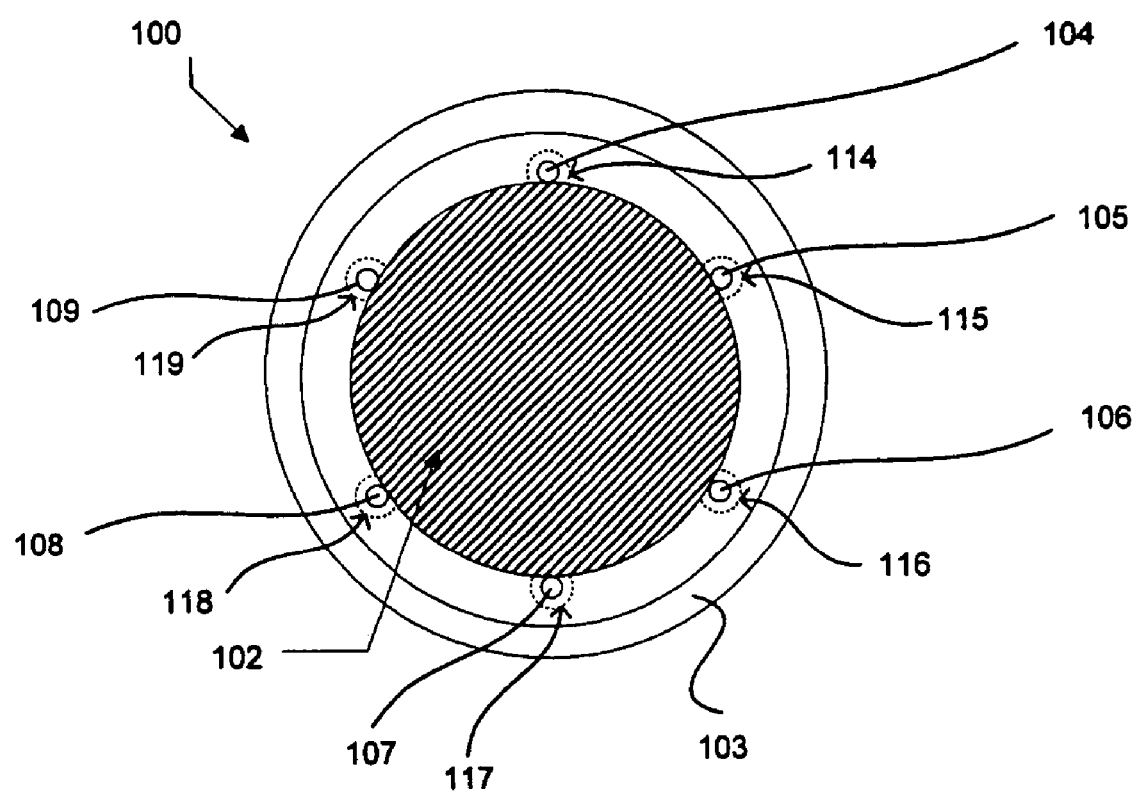
FIG. 1 is a diagrammatic top view of a wafer chuck in accordance with one embodiment of the present invention.

FIG. 1 illustrates a diagrammatic top view of a wafer chuck system 100 in accordance with one embodiment of the present invention. According to this embodiment, the wafer 102 is positioned for spin processing by wafer chuck tips 104–109. The wafer chuck tips 104–109 are formed in two groups according to one embodiment of the present invention. That is, a first group of wafer chuck tips 104, 106, and 108 are arranged equally to surround the wafer. That is, the wafer tips are preferably spaced uniformly around the circumference of the wafer when holding the wafer. A second grouping of chuck tips, wafer chuck tips 105, 107 and 109 are also arranged equally around the periphery of the wafer and arranged to engage the wafer edge.

Preferably, the first group of chuck tips are engaged for a portion of the clean (etch) cycle and the second grouping of chuck tips are engaged during at least the remaining portion of the clean cycle. That is, each of the first and second grouping of chuck tips have a duty cycle of less than 100%. Preferably the duty cycle for the first group will overlap somewhat the duty cycle of the second group to enable better stability in transfer of handling responsibilities from the first group of chuck tips to the second group of chuck tips during the spin processing.

Techniques for extending chuck tips to hold a wafer and driving mechanisms for driving chuck tips are known to those of skill in the art and thus the examples provided in the description are included only for illustration purposes and are not intended to limit the invention. The chuck tips may be driven by any suitable means for controllably extending the chuck tips into position for holding the wafer. For example, drive units 114–119 as illustrated in FIG. 1 may be connected to any suitable means for positioning the wafer chuck tips to hold the wafer. For example, the wafer chuck tips may be extended by any electromagnetic, hydraulic, pneumatic, or mechanical means, as known to those of skill in the relevant art. The drive units 114–119 are shown in general diagrammatic form to illustrate their general coupling to the wafer chuck tips 104–109, and not to indicate any particular form of drive unit. Typically, actuators and connecting linkage and other force transfer mechanisms utilized in moving the wafer tips into position and to maintain pressure on the wafer are located within the body of the chuck 103 below the back surface of the wafer. Embodiments of the present invention are intended to extend to include any and all types of drive mechanisms, irrespective of their locations within the chuck.

Moreover, although wafer chuck tips may typically be extended in a direction substantially parallel to the axis of rotation of the wafer and chuck, the embodiments of the invention are not so limited. For example, embodiments of the present invention are intended to apply also to wafer chuck tips which extend either partially or completely in a lateral direction (i.e., towards the edge of a held wafer in the plane of the wafer).

Each of the drive units may be individually controlled or alternatively controlled in groups. That is, the drive units may be controlled by suitable controllers so that each of the chuck tips belonging to a grouping extend substantially simultaneously. Preferably, in an embodiment where the wafer chuck tips are configured to engage the wafer in two different groupings, i.e., a first grouping for a first time interval of the etch cycle and a second grouping for a second time interval of that etch cycle, two independent drive units will be provided. For example, the first grouping of wafer chuck tips may be extended by a common drive unit with the second grouping extended by a second common drive unit.

Of course, with the benefit of the guidance provided in this specification, one skilled in the art could configure wafer chuck tips having independent drive mechanisms for each tip, for example individually controlled electromagnetic drives, to extend in groups. For example, such responses can individually be programmed by a controller connected to the individual drive units for each tip. Thus, the embodiments of the present invention are intended to extend to all such variations where the extension and retraction of wafer chuck tips to and from the wafer occurs in two or more independently controllable groups. That is, by incorporating at least two independent chucking drives, wafer chucks as described in embodiments of the present invention are able to more effectively and efficiently perform etching during spin processing.

According to an alternative embodiment of the present invention, the chuck tips are positioned around the periphery of the wafer so that the chuck tips are extended and retracted in one of three separate groups. As discussed above, in this alternative embodiment there will preferably be some overlap so that when groups of three wafer chuck tips are utilized, the duty cycle (i.e., the portion of the complete cleaning cycle) for each such state will exceed 33.33% by a slight amount, such as for example, a duty cycle of 35–40%.

It is recognized that some finite period of time may be necessary for the chuck tips to extend to a position where they are engaged with the wafer and conversely a like period of time for the chuck tips to retract from their extended position, i.e., in contact with the wafer to a fully retracted position. Variations in the control signal to accommodate the time periods are within the ability of one of skill in the art and therefore will not be described further here.

Although embodiments have also been described with wafer chuck tips having a "nail-like" shape, the invention is not so limited. Although minimizing the contact area between the wafer and the chuck tips is preferable, the apparatus and techniques of the present invention in changing engagement of the tips between groups of tips permits greater flexibility in the shape of the wafer chuck tip. That is, wafer chuck tips which have shapes that adversely affect the flow of etchant chemicals can be used, the effect minimized due to the changing engagements (i.e., extensions) between the groups of tips. For example, larger tips or tips configured in clamp-like shapes may be used. Thus, embodiments of the present invention may be used with a variety of wafer chuck tip shapes.

Figure 2:
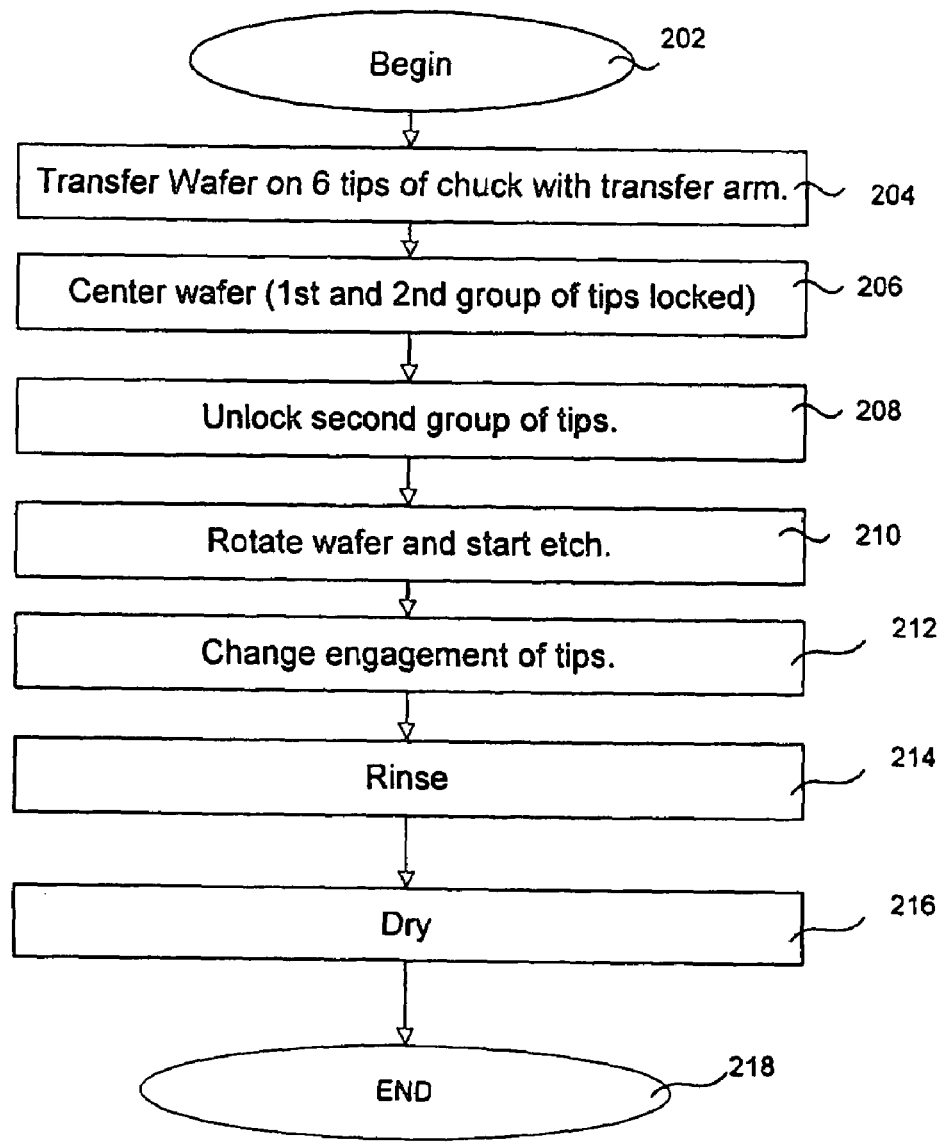
FIG. 2 is a flowchart illustrating a method of holding a wafer for cleaning the edge areas of a wafer in accordance with one embodiment of the present invention.

FIG. 2 is a flowchart illustrating a method 200 of cleaning a wafer in accordance with one embodiment of the present invention. The wafer cleaning or etching process 200 begins at a step 202 with selection of a single wafer for further processing. Next, at a step 204, the wafer is transferred to the spin processor. Wafer transfer is effectuated with a transfer arm holding both the chuck and the wafer. For purposes of illustration of this embodiment, the wafer chuck is described as having 6 wafer tips, arranged in two groups. That is, the wafer chuck tips are arranged uniformly around the perimeter of the wafer but activated in either a first group or a second group. This example is provided for illustration purposes and is not intended to be limiting. During transfer, all of the six tips engage the wafer.

Next, during step 206, the wafer is placed in a centering position with all (six) of the tips locking. It should be appreciated that in accordance with one embodiment, transfer of the wafer and chuck by the transfer arm occurs with the wafer retained by the wafer tips in a partially extended position, i.e., the wafer tips acting to hold the wafer without being fully extended into a locking position. Alternatively, the wafer and chuck may be transferred with all tips locking the wafer in position.

In a subsequent step 208, the first group of tips maintain their locked position (i.e., fully extended) while the second group of tips is unlocked (i.e., retracted).

Next, in step 210, wafer rotation starts and etching commences. Typically, an etchant chemical is dispersed over selected areas of the wafer to perform the etching. Thus, during the initial part of the etching cycle, the wafer is held by the first group of tips.

After approximately half of the etching time is completed the second group of tips are extended (i.e. locked) and the first group of tips retract (i.e., unlock) in step 212. This changeover occurs with the wafer still rotating. With this arrangement, it is not necessary to stop rotation of the wafer in order to change the wafer location relative to the tips. Accordingly, process time is reduced.

Next the rinse step 214 is completed followed by the drying step 216. For each of these steps, preferably the second group of tips continue to be extended to engage the wafer. The process ends at a step 218. Thus, by changing the engagement of the tips from a first group to a second group with the wafer still rotating, better etching performance is achieved by decreasing the adverse influence of the tips. Preferably, the wafer will be retained by 6 wafer chuck tips, acting in groups of three. Preferably, the wafer chuck tips will be spaced uniformly around the perimeter (i.e., circumference) of the wafer, although the invention is not so limited. In an alternative embodiment, nine wafer chuck tips are available to retain the wafer, acting in groups of three. That is, changeover of holding tips (i.e., changing engagement of the tips from one group to another) occurs twice during the etch cycle in this alternative embodiment. The first changeover occurs form the first group of 3 tips to the second group of 3 tips and the second changeover involves a change from the second group to the third group of tips. In this embodiment, three independent chucking drives are employed.

In yet another alternative embodiment, the sequence of groups of tips engaged with the wafer tips is configured so that the tip changeover occurs twice during the etch step, but with only two groups of tips used. That is, for example, the first group of tips are initially extended during the etch cycle, followed by extension of the second group (and the retraction of the first group), followed by extension of the first group again (and retraction of the second). Of course many different variations are possible with the concepts and guidance provided by the invention and the scope of the present invention is intended to extend to include those variations. Although described preferably as using 3 tips in each group to engage the wafer, the invention is not so limited. Any number of tips may constitute a group. For example, the first group or plurality of tips may include 6 tips to engage the wafer whereas the second group may include 4 tips.

The embodiments of the present invention have generally been described with reference to a spin process cleaning of a wafer edge but should not be interpreted as limiting the invention. It should be appreciated that the embodiments of the present invention may be adapted to work with other semiconductor processes where a wafer chuck rotates a wafer as part of the process. Minor modifications may be performed to enable these adaptations within the knowledge of those of skill in the art.

By using the apparatus and methods of the present invention, etching of the top edge, backside edge, and bevel of the wafer may be performed to remove films that may flake off during subsequent wafer processing after thin film deposition, etching, or photo masking steps. Further, by using this apparatus, edge etching may be performed in a single step process, without the need to remove and reposition the wafer during the cleaning. By avoiding the stopping of the rotation of the chuck to reposition the wafer, unnecessary drying steps may be avoided. Thus, the described apparatus and methods enable effective cleaning of the edge, bevel, and backsides of the wafer and shortens the process time.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A wafer chuck for supporting a wafer during spin process cleaning of edges, bevels, and backsides of a wafer, the wafer chuck comprising:
   a first plurality of retractable wafer chuck tips to engage the edge of the wafer by extending the first set of retractable wafer chuck tips from the wafer chuck in a direction substantially parallel to the axis of rotation of the wafer chuck; and
   a second plurality of retractable wafer chuck tips to engage the edge of the wafer by extending the second plurality of retractable wafer chuck tips from the wafer chuck in a direction substantially parallel to the axis of rotation of the wafer chuck, wherein the first and second pluralities of retractable wafer chuck tips are configured so that in a first state the first plurality of retractable wafer chuck tips are engaged with the edge of the wafer and the second plurality of retractable wafer chuck tips are not engaged with the edge of the wafer and wherein in a second state the first plurality of retractable wafer chuck tips are not engaged with the edge of the wafer and the second plurality of retractable wafer chuck tips are engaged with the edge of the wafer.

2. The wafer chuck as recited in claim 1, wherein the first and second pluralities of retractable wafer chuck tips are coupled with a drive mechanism for engaging the tips with the wafer edge.

3. The wafer chuck as recited in claim 2, wherein the drive mechanism is a hydraulic drive mechanism.

4. The wafer chuck as recited in claim 2, wherein the drive mechanism is one of a pneumatic, electromagnetic, or mechanical drive mechanism.

5. The wafer chuck as recited in claim 1, wherein the first plurality of retractable wafer chuck tips comprises 3 tips.

6. The wafer chuck as recited in claim 1, wherein each of the first and second pluralities of retractable wafer chuck tips comprises 3 tips.

7. The wafer chuck as recited in claim 2, wherein the first and second pluralities of retractable wafer chuck tips are placed in one of the first and second states by a controller coupled to the drive mechanism.

8. The wafer chuck as recited in claim 2, wherein the drive mechanism includes individually controllable drive units for each tip in each of the first and second pluralities of retractable wafer chuck tips.

9. The wafer chuck as recited in claim 1, further comprising a third plurality of retractable wafer chuck tips to engage the edge of the wafer by extending the third set of retractable wafer chuck tips from the wafer chuck in a direction substantially parallel to the axis of rotation of the wafer chuck, and wherein the first, second, and third pluralities of retractable wafer chuck tips are configured so that in a third state the first and second pluralities of retractable wafer chuck tips are not engaged with the edge of the wafer and the third plurality of retractable wafer chuck tips is engaged with the edge of the wafer.

10. The wafer chuck as recited in claim 9, wherein the first, second, and third pluralities of retractable wafer chuck tips are configured to enter the second state after the first state and to enter the third state after the second state, each state occurring during the continuous rotation of the wafer.

11. The wafer chuck as recited in claim 9, wherein each of the first and second and third pluralities of retractable wafer chuck tips comprises 3 tips.

* * * * *